(12) United States Patent
Bartoli et al.

(10) Patent No.: US 6,442,068 B1
(45) Date of Patent: Aug. 27, 2002

(54) NON-VOLATILE MEMORY WITH FUNCTIONAL CAPABILITY OF BURST MODE READ AND PAGE MODE READ DURING SUSPENSION OF AN OPERATION OF ELECTRICAL ALTERATION

(75) Inventors: Simone Bartoli; Lorenzo Bedarida, both of Milan; Mauro Sali, Lodi; Antonio Russo, Milan, all of (IT)

(73) Assignee: STMicroelectronics S.R.L., Agrate Brianza (IT)

( * ) Notice: Subject to any disclaimer, the term of this patent is extended or adjusted under 35 U.S.C. 154(b) by 56 days.

(21) Appl. No.: 09/619,589

(22) Filed: Jul. 19, 2000

(51) Int. Cl.⁷ .............................................. G11C 11/34
(52) U.S. Cl. .............................. 365/185.12; 365/230.03
(58) Field of Search ......................... 365/185.12, 230.03

(56) References Cited

U.S. PATENT DOCUMENTS

| | | | |
|---|---|---|---|
| 5,355,464 A | 10/1994 | Fandrich et al. | ............ 395/425 |
| 6,031,785 A | * 2/2000 | Park et al. | ............. 365/230.08 |

FOREIGN PATENT DOCUMENTS

| | | | |
|---|---|---|---|
| JP | 0186293 | * 11/1982 | ........... G11C/17/00 |
| WO | 98/12704 | 3/1998 | ........... G11C/16/10 |

OTHER PUBLICATIONS

Betty Prince, "Semiconductor Memories", 1983, Wiley, 2 nd Edition, pp. 589–593.*

* cited by examiner

Primary Examiner—M. Tran
(74) Attorney, Agent, or Firm—Lisa K. Jorgenson; Allen, Dyer, Doppelt, Milbrath & Gilchrist, P.A.

(57) ABSTRACT

An electrically alterable semiconductor memory includes at least two memory sectors the content of which is individually alterable, and a control circuit for controlling operations of electrical alteration of the content of the memory, permitting the selective execution of an operation of electrical alteration of the content of one of the memory sectors with the possibility of suspending the execution to permit read access to the other of the memory sectors. The control circuit is also capable of permitting, during the suspension, an operation of burst mode or page mode reading of the content of the other memory sector.

29 Claims, 3 Drawing Sheets

NON-VOLATILE MEMORY WITH FUNCTIONAL CAPABILITY OF BURST MODE READ AND PAGE MODE READ DURING SUSPENSION OF AN OPERATION OF ELECTRICAL ALTERATION

FIELD OF THE INVENTION

The present invention relates to the field of semiconductor memories, and, more particularly to non-volatile memories the content of which is electrically alterable (programmable or programmable and erasable), such as EPROMs, EEPROMs and Flash EEPROMs.

BACKGROUND OF INVENTION

A normal read operation (hereinafter, standard read) in a memory provides for supplying to the memory an address which identifies a corresponding location of the memory. After a specific time interval has elapsed, termed access time, the data stored in the location is available at the output of the memory.

Memories are known in which, besides the standard read operation, it is possible to carry out a page mode read operation which based upon only the less significant bits of the address being supplied at the input of the memory vary to obtain valid data at the output of the memory in a shorter time than the standard access time. Other known memories, however, in addition to the possibility of carrying out a standard read, have the possibility of carrying out a so-called burst mode read. By supplying to the memory an external clock signal and an address corresponding to an initial memory location, the memory internally increments the address automatically and delivers at the output new data corresponding to the successive memory addresses at each cycle of the clock signal. This read mode makes it possible to reduce significantly the access time in all those cases where, instead of accessing locations distributed randomly in the memory space, it is necessary to access a certain number of contiguous locations.

Also known are electrically programmable and erasable non-volatile memories organized in sectors, or portions of memory which can be erased and programmed independently of one another. Memories of this type may in addition have a functional capability termed temporary suspension of erasure ("erase suspend") or of programming ("program suspend"), which makes it possible to suspend temporarily the operation of erasure or programming of a sector to carry out a standard read access to one of the other memory sectors. Since the read is however a standard type read, the possibilities of a reduction in the access time offered by the two read modes described previously are not utilized. Rapid access to the memory with a burst read or page read mode is only permitted on completion of the programming or erasure.

SUMMARY OF THE INVENTION

In view of the state of the art described, it is an object of the present invention to provide a memory having the functional capability of burst mode read and/or page mode read also while the erasure or programming of a sector is taking place.

According to the present invention, this object is achieved by provision of an electrically alterable semiconductor memory comprising a plurality of memory sectors, each having a content being individually electrically alterable; and a control circuit for controlling operation of electrical alteration of the content of the memory sectors, for permitting selective execution of an operation of electrical alteration of the content of one of the memory sectors with a possibility of suspending execution to permit read access to at least one other of the memory sectors, and for permitting during suspension a burst mode read operation of the at least one other memory sector. The control circuit may include a circuit for controlling the electrical alteration operations, a scanning circuit for scanning memory locations of the memory sectors, and a circuit for controlling the burst mode read operations. The memory according to the invention has the advantage of permitting, during the execution of an operation of erasure or programming of a memory sector, rapid access in burst mode or page mode to another memory sector.

BRIEF DESCRIPTION OF THE DRAWINGS

The characteristics and advantages of the present invention will become clear from the following detailed description of one of its embodiments, illustrated by way of non-limiting example in the appended drawings, in which.

DETAILED DESCRIPTION OF THE PREFERRED EMBODIMENTS

Figure 1:
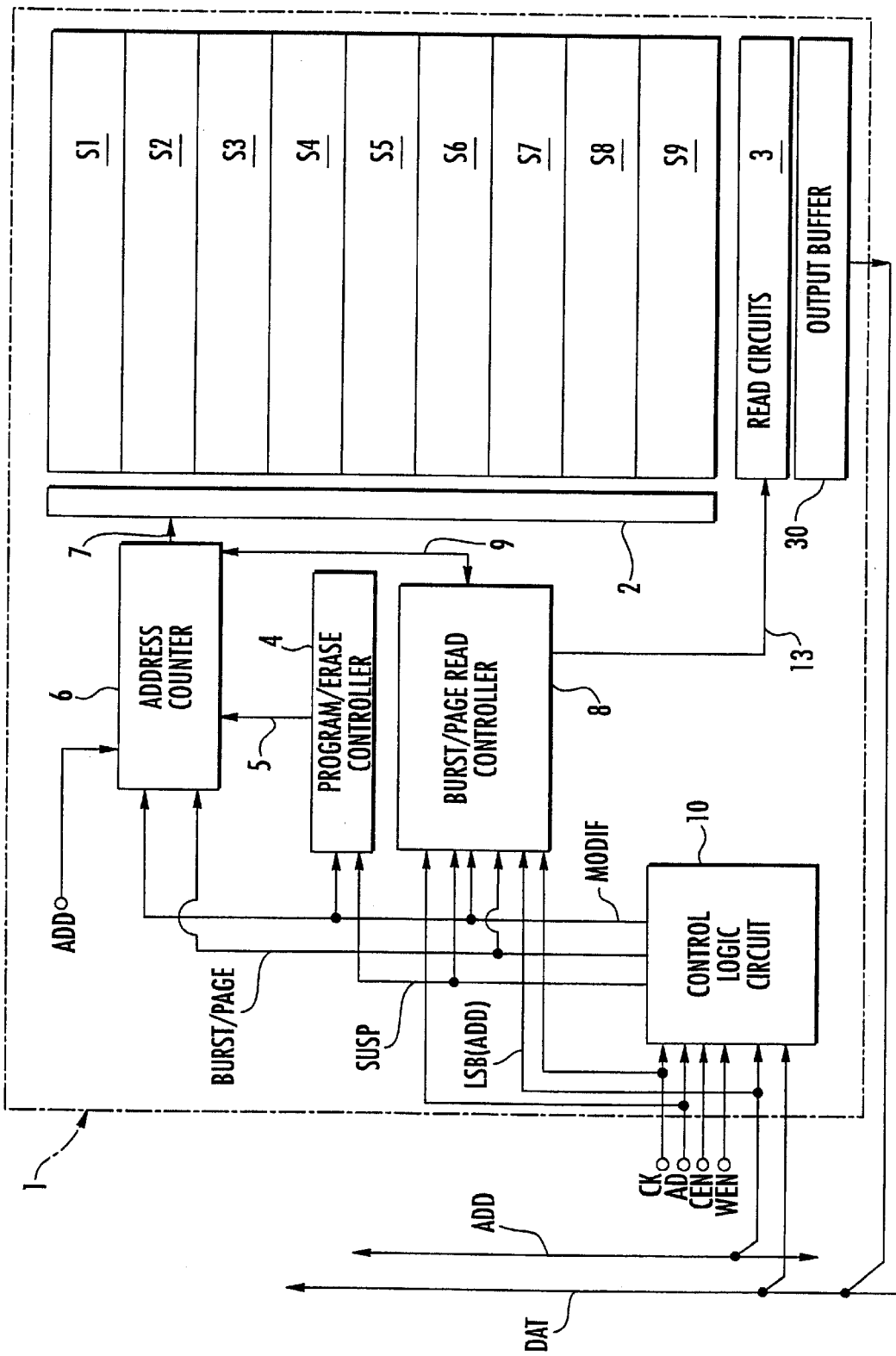
FIG. 1 shows diagrammatically, in terms of the principal functional blocks, a memory according to the present invention.

With reference to the drawings, a non-volatile memory 1 with electrically alterable content, for example an EPROM, or EEPROM, or Flash EEPROM memory, comprises a plurality of memory sectors S1–S9, or, in the exemplary case of a Flash EEPROM memory, portions of memory which can be erased independently of one another. The memory also includes decoding and line selection circuits 2, circuits 3 ("sense circuits") for reading the memory cells, and an output buffer block 30. The circuits 2, 3 and 30 are known to those skilled in the art and are therefore only shown diagrammatically as functional blocks.

A block labelled 10 identifies a control logic circuit internal to the memory 1. The block 10 receives external address signals ADD from an address signal bus external to the memory 1, DAT signals from a data bus also external to the memory 1, an external signal CEN (Chip Enable) for enabling the memory 1, an external signal WEN for controlling an operation of modification of the content of the memory 1 (Write Enable), an external clock signal CK, and an external signal AD which is activated externally, for example, by a microprocessor which manages the memory 1, when a new address valid for the memory 1 is present at the address bus.

Figure 2:
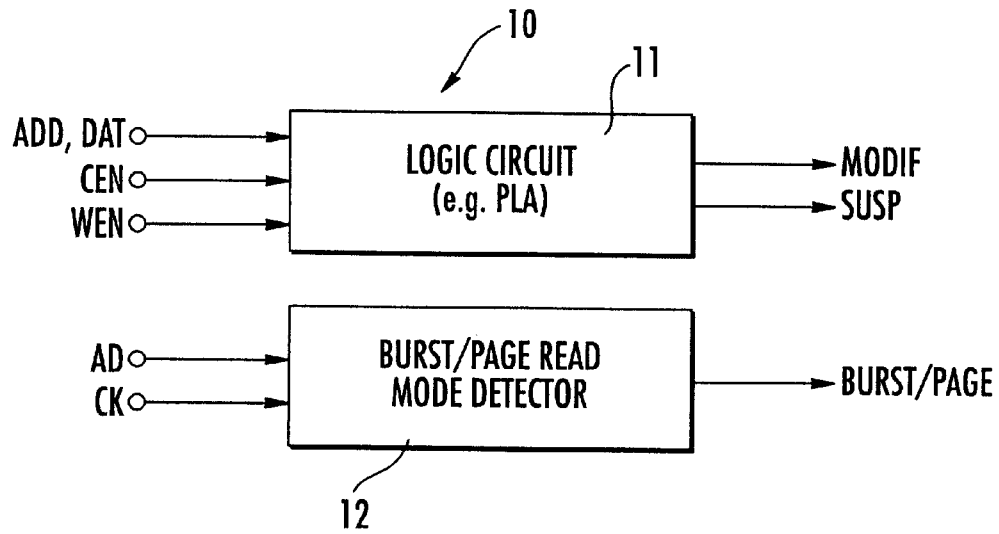
FIG. 2 is a block diagram of a logic circuit for controlling the memory in FIG. 1.

As shown in greater detail in FIG. 2, the control logic circuit 10 comprises a logic circuit 11 for interface and interpretation of external commands, for example, implemented by a PLA (Programmable Logic Array). The logic circuit 11 interprets sequences of commands which are presented to it by way of the signals ADD and DAT, and in response to the fact that the memory is enabled (CEN signal active) and that the content thereof is to be modified (or is brought into "write mode" by activation of the signal WEN) actuates a signal MODIF. The logic circuit 11, by interpreting sequences of commands received through the signals ADD and DAT, generates a signal SUSP which is activated whenever an activity of modification of the content of the memory which is taking place needs to be suspended temporarily to carry out reading of the memory.

The control logic circuit 10 further comprises a block 12 detecting the burst read or page read mode. The block 12 receives the signals AD and CK. If the external clock signal CK is present, the activation of the signal AD determines the activation of the BURST/PAGE signal which in turn determines the entry into the burst read or page read mode.

Returning to FIG. 1, a block 4 identifies a circuit for controlling the operations of electrical alteration of the content of the memory 1, for example, in the case of a Flash EEPROM memory, of the programming and erasure operations. The circuit 4 receives the signals MODIF and SUSP. The signal MODIF, if active (either at the high or low logic level), indicates that on one of the memory sectors S1–S9 a programming or erasure operation should be carried out. The signal SUSP, if active (either at the high or low logic level), indicates that the operation of erasure which is taking place on one of the memory sectors S1–S9 should be temporarily suspended, to carry out a read operation.

The circuit 4 has a (group of) output signals 5 which controls an address counter 6. The address counter 6 makes possible internal scanning of the addresses of the memory, and supplies to the decoding and line selection circuit 2 signals 7 carrying memory location addresses. The address counter 6 also receives the signal MODIF and the signal BURST/PAGE, as well as the external address signals ADD.

A block labelled 8 identifies a circuit for controlling the burst mode read or page mode read operations. The circuit 8 receives the signals BURST/PAGE, MODIF, SUSP, CK and a subset LSB(ADD) of the address signals ADD which comprises the less significant bits of the address supplied to the memory 1. The block 8 supplies to the address counter 6 a (group of) control signals 9 and further controls the read circuits 3 through control signals 13. The outputs of the read signals 3 are supplied to the output buffer block 30 and then placed on the external data bus DAT.

The two control circuits 4 and 8, which respectively control the programming or erasure operation, and the burst mode read or page mode read operation, operate simultaneously and make possible the suspension of the erasure or programming operation taking place on one of the memory sectors S1–S9. This permits carrying out a burst mode read or page mode read in any one of the remaining memory sectors.

Figure 3:
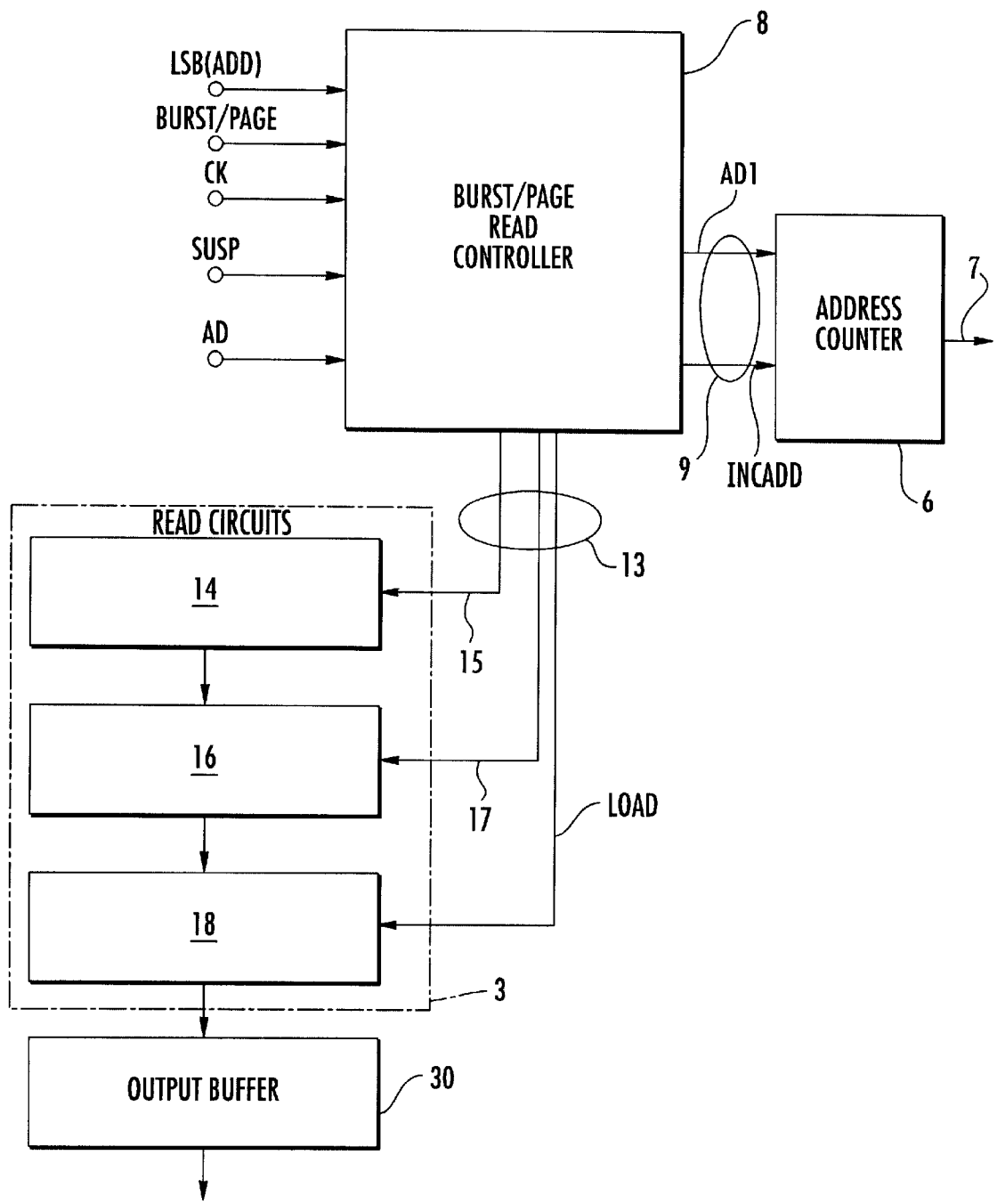
FIG. 3 is a more detailed block diagram of part of the memory in FIG. 1.

FIG. 3 shows in more detail, still in terms of a block diagram, the control operated by the block 8 on the address counter 6 and on the read circuits 3, a more detailed illustration of the latter also being provided. The signals 9 comprise a signal AD1, which is activated by the circuit 8 so that the address counter 6 loads the address currently present on the external address signals ADD, and a signal INCADD which is activated to command the address counter 6 to increment the internal address 7 to be supplied to the selection circuits 2.

The read circuits 3 shown diagrammatically in FIG. 1 comprise a plurality of actual read circuits 14, of a type which is known to those skilled in the art, and which provide for the reading in parallel of a respective plurality of locations in one of the memory sectors S1–S9, for example, four locations in parallel. The read circuits 14 receive from the block 8 signals 15 necessary for their operation, for example, signals for the starting of a phase of discharge of the selected bit lines and signals for storing of the data read. The outputs of the read circuits 14 are supplied to a decoder 16 which, on the command of a signal 17 supplied by the block 8, provides for selecting one of the outputs of the plurality of read circuits 14, and for supplying said selected output to a latch bank 18, operated by a signal LOAD supplied by the block 8. The latch outputs 18 are supplied to the output buffer block 30.

Figure 4:
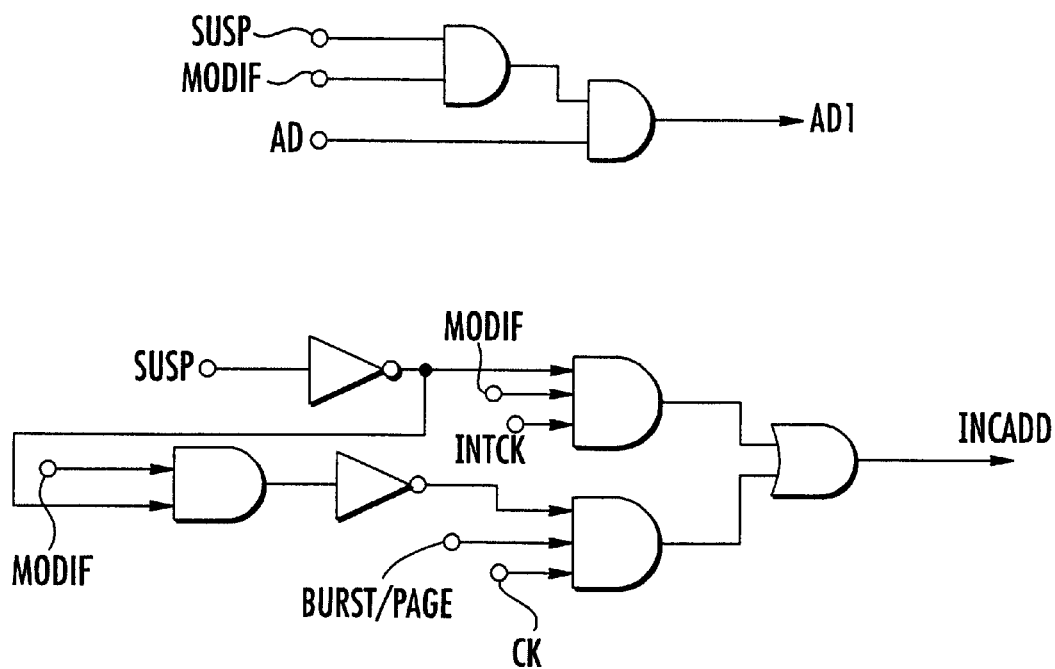
FIG. 4 is a simplified diagrammatic view, in terms of logic gates, of the operation of a circuit for controlling burst mode read or page mode read operations of the memory in FIG. 1.

FIG. 4 shows diagrammatically, in terms of logic gates, the operation of the block 8. The signal AD1, which is activated to cause the address counter 6 to load the address currently present on the signals ADD, is activated upon activation of the external signal AD (valid address at the address bus ADD), but only if there is not an operation of modification of the content of a memory sector S1–S9 taking place (signal MODIF deactivated) or, while a modification operation is also taking place (signal MODIF active), a command for suspension of the operation has arrived to allow a read (SUSP signal active).

The signal INCADD, which determines the incrementation of the internal address 7 by the address counter 6, is generated in synchronism with the external clock signal CK, but only if the BURST/PAGE signal is active and if a) there is no operation of modification of the content of a memory sector S1–S9 taking place (signal MODIF deactivated), or b) while a modification operation is taking place, the signal SUSP is active (suspension of the modification to allow read access to another memory sector). If, however, an operation of modification of the content of a sector is taking place, and a suspension command has not arrived, the signal INCADD is generated in synchronism with an internal clock signal INTCK, generated by a logic circuit for controlling the algorithms for modification of the memory content, for example, by the block 4 in FIG. 1.

For example, let it be assumed that on the memory sector S1 an erasure operation ("erase mode") is being carried out, and at the same time it is desired to access another sector, for example the memory sector S2, to carry out a burst mode read or page mode read. The signal MODIF will be active, to indicate that an operation of modification of the content of a sector is taking place, and the signal SUSP will be activated, so that the control circuit 4 suspends the erase operation. The BURST/PAGE signal will furthermore be activated, so that the control circuit 8, through the address counter 6, can start a burst mode read or page mode read operation on the sector S2.

The memory according to the invention has the advantage of permitting, during the execution of an operation of erasure of a memory sector, rapid access in burst mode or page mode to another memory sector (faster access than that which would occur with a standard read), without having to wait for the completion of the erasure of the sector. As will be appreciated by those skilled in the art, the memory 1 can also operate in standard mode for reading a memory sector by suspending the operation of programming or erasure of the content of another sector.

It is clear that variants and/or additions may be made to what has been described and illustrated above, without thereby departing from the scope of the present invention defined in the appended claims.

That which is claimed is:

1. An electrically alterable semiconductor memory comprising:
   a plurality of memory sectors, each having a content being individually electrically alterable; and a control circuit, including a scanning circuit for scanning memory locations of memory sectors, said control circuit being operative for controlling operation of electrical alteration of the content of the memory sectors, for permitting selective execution of an operation of electrical alteration of the content of one of said memory sectors and suspending execution to permit read access to another of said memory sectors, and for permitting during suspension a burst mode read or page mode read operation for reading the content of the other memory sector and receiving and interpreting command signals external to the memory.

2. A memory according to claim 1, wherein said control circuit comprises:
   a circuit for controlling the electrical alteration operations; and
   a circuit for controlling the burst mode read or page mode read operations.

3. A memory according to claim 1, wherein said scanning circuit comprises an address counter.

4. A memory according to claim 2, wherein said circuit for controlling the electrical operation comprises a circuit for performing at least one of programming and erasing.

5. A memory according to claim 2, wherein said circuit for controlling the burst mode read or page mode read operations also controls loading of an external address currently supplied to the memory into said scanning circuit, the external address identifying an initial memory location of the burst mode read or page mode read operation.

6. A memory according to claim 5, wherein said circuit for controlling the burst mode read or page mode read operations further controls successive scanning of memory locations contiguous with said initial memory location.

7. A memory according to claim 1, further comprising a logic control circuit connected to said control circuit for receiving and interpreting command signals external to the memory.

8. A memory according to claim 7, wherein said logic control circuit generates signals to control execution of an operation of electrical alteration of the content of one of the memory sectors and to control the suspension of the execution, and further generates signals to control an operation of burst mode or page mode reading of the other of said memory sectors during the suspension.

9. An electrically alterable semiconductor memory comprising:
   a plurality of memory sectors, each having a content being individually electrically alterable; and
   a control circuit, including a scanning circuit for scanning memory locations of memory sectors, said control circuit being operative for controlling operation of electrical alteration of the content of the memory sectors, for permitting selective execution of an operation of electrical alteration of the content of one of said memory sectors and suspending execution to permit read access to at least one other of said memory sectors, and for permitting during suspension a burst mode read operation of the at least one other memory sector and receiving and interpreting command signals external to the memory.

10. A memory according to claim 9, wherein said control circuit comprises:
    a circuit for controlling the electrical alteration operations; and
    a circuit for controlling the burst mode read operations.

11. A memory according to claim 9, wherein said scanning circuit comprises an address counter.

12. A memory according to claim 10, wherein said circuit for controlling the electrical operation comprises a circuit for performing at least one of programming and erasing.

13. A memory according to claim 10, wherein said circuit for controlling the burst mode read operations also controls loading of an external address currently supplied to the memory into said scanning circuit, the external address identifying an initial memory location of the burst mode read operation.

14. A memory according to claim 13, wherein said circuit for controlling the burst mode read operations further controls successive scanning of memory locations contiguous with said initial memory location.

15. A memory according to claim 9, further comprising a logic control circuit connected to said control circuit for receiving and interpreting command signals external to the memory.

16. A memory according to claim 15, wherein said logic control circuit generates signals to control execution of an operation of electrical alteration of the content of one of the memory sectors and to control the suspension of the execution, and further generates signals to control an operation of burst mode reading of the at least one other memory sector during the suspension.

17. An electrically alterable semiconductor memory comprising:
    a plurality of memory sectors, each having a content being individually electrically alterable; and
    a control circuit, including a scanning circuit for scanning memory locations of memory sectors, said control circuit being operative for controlling operation of electrical alteration of the content of the memory sectors, for permitting selective execution of an operation of electrical alteration of the content of one of said memory sectors and suspending execution to permit read access to at least one other of said memory sectors, and for permitting during suspension a page mode read operation of the at least one other memory sector and receiving and interpreting command signals external to the memory.

18. A memory according to claim 17, wherein said control circuit comprises:
    a circuit for controlling the electrical alteration operations; and
    a circuit for controlling the page mode read operations.

19. A memory according to claim 17, wherein said scanning circuit comprises an address counter.

20. A memory according to claim 18, wherein said circuit for controlling the electrical operation comprises a circuit for performing at least one of programming and erasing.

21. A memory according to claim 18, wherein said circuit for controlling the page mode read operations also controls loading of an external address currently supplied to the memory into said scanning circuit, the external address identifying an initial memory location of the page mode read operation.

22. A memory according to claim 21, wherein said circuit for controlling the page mode read operations further controls successive scanning of memory locations contiguous with said initial memory location.

23. A memory according to claim 22, further comprising a logic control circuit connected to said control circuit for receiving and interpreting command signals external to the memory.

24. A memory according to claim 23, wherein said logic control circuit generates signals to control execution of an operation of electrical alteration of the content of one of the memory sectors and to control the suspension of the execution, and further generates signals to control an operation of page mode reading of the at least one other memory sector during the suspension.

25. A method for operating an electrically alterable semiconductor memory comprising a plurality of memory sectors, each having a content being individually electrically alterable, the method comprising:

selectively executing an operation of electrical alteration of the content of one of said memory sectors and suspending execution to permit read access to at least one other of said memory sectors; and permitting during suspension a burst mode read or page mode read operation for reading the content of the at least one other memory sector, wherein the electrical alteration comprises at least one of programming and erasing.

26. A method according to claim 25, wherein the electrical alteration comprises at least one of programming and erasing.

27. A method according to claim 25, further comprising controlling loading of an external address currently supplied to the memory into a scanning circuit, the external address identifying an initial memory location of the burst mode read or page mode read operation.

28. A method according to claim 27, wherein controlling loading further comprises successive scanning of memory locations contiguous with said initial memory location.

29. A method according to claim 25, further comprising receiving and interpreting command signals external to the memory.

* * * * *

UNITED STATES PATENT AND TRADEMARK OFFICE
CERTIFICATE OF CORRECTION

PATENT NO.    : 6,442,068 B1
DATED         : August 27, 2002
INVENTOR(S)   : Simone Bartoli, Lorenzo Bedarida, Mauro Sali and Antonio Russo It is certified that error appears in the above-identified patent and that said Letters Patent is hereby corrected as shown below:

<u>Title page,</u>
Item [30], Priority data missing insert
-- [30] Foreign Application Priority Data
July 30, 1999 (EP) ............ 99830494.3 --

Signed and Sealed this

First Day of April, 2003

JAMES E. ROGAN
*Director of the United States Patent and Trademark Office*